United States Patent
Proell et al.

(10) Patent No.: US 10,455,676 B2
(45) Date of Patent: Oct. 22, 2019

(54) TRANSFORMER UNIT AND METHOD FOR OPERATING A TRANSFORMER UNIT

(71) Applicant: Siemens Healthcare GmbH, Erlangen (DE)

(72) Inventors: Tobias Proell, Eckental (DE); Josef Deuringer, Herzogenaurach (DE)

(73) Assignee: SIEMENS HEALTHCARE GMBH, Erlangen (DE)

(*) Notice: Subject to any disclaimer, the term of this patent is extended or adjusted under 35 U.S.C. 154(b) by 0 days.

(21) Appl. No.: 16/191,665

(22) Filed: Nov. 15, 2018

(65) Prior Publication Data
US 2019/0159326 A1    May 23, 2019

(30) Foreign Application Priority Data
Nov. 23, 2017 (DE) .......................... 10 2017 220 991

(51) Int. Cl.
| | |
|---|---|
| H05G 1/32 | (2006.01) |
| H03M 1/12 | (2006.01) |
| H05G 1/14 | (2006.01) |
| H05G 1/26 | (2006.01) |
| H05G 1/48 | (2006.01) |

(52) U.S. Cl.
CPC .............. *H05G 1/32* (2013.01); *H03M 1/12* (2013.01); *H05G 1/14* (2013.01); *H05G 1/265* (2013.01); *H05G 1/48* (2013.01)

(58) Field of Classification Search
CPC .......... H05G 1/32; H05G 1/14; H05G 1/265; H05G 1/48; H03M 1/12; H02M 3/3353
See application file for complete search history.

(56) References Cited

U.S. PATENT DOCUMENTS

| | | | |
|---|---|---|---|
| 4,200,796 A * | 4/1980 | Murakami | G05F 1/14 378/102 |
| 4,467,406 A | 8/1984 | Hattori et al. | |
| 5,068,776 A | 11/1991 | Polivka | |
| 5,138,543 A | 8/1992 | Harm et al. | |
| 5,438,499 A | 8/1995 | Bonte et al. | |

(Continued)

OTHER PUBLICATIONS

German Office Action for DE 102017220991.7 dated Jul. 31, 2018.

*Primary Examiner* — Kyle J Moody
(74) *Attorney, Agent, or Firm* — Harness, Dickey & Pierce, P.L.C.

(57) ABSTRACT

A transformer unit includes a primary side including a primary coil wound around a transformer core and a secondary side including a secondary coil wound around the core. During operation, a secondary-side actual voltage is established upon application of a primary voltage to the primary coil. The transformer unit includes a first measuring coil, wound around the transformer core, to determine a first measuring voltage; a measuring element, arranged and designed on the primary side to determine a second measuring voltage, the second measuring voltage being correlatable with the additional secondary-side voltage drop; and a controller to control operation of the transformer unit, the controller being designed to adjust the primary voltage so as to induce a secondary desired voltage in the secondary coil, and adjust the primary voltage as a function of the first measuring voltage and the second measuring voltage.

19 Claims, 1 Drawing Sheet

(56) References Cited

U.S. PATENT DOCUMENTS

| | | | |
|---|---|---|---|
| 6,990,000 B1 * | 1/2006 | Rodriguez | H02M 3/33515 363/97 |
| 9,270,183 B2 * | 2/2016 | Knoedgen | H02M 3/33507 |
| 10,158,282 B1 * | 12/2018 | Maruyama | H02M 1/36 |
| 2013/0335043 A1 | 12/2013 | He et al. | |
| 2019/0068064 A1 * | 2/2019 | Sonobe | H02M 1/08 |

* cited by examiner

FIG. 1

TRANSFORMER UNIT AND METHOD FOR OPERATING A TRANSFORMER UNIT

PRIORITY STATEMENT

The present application hereby claims priority under 35 U.S.C. § 119 to German patent application number DE 102017220991.7 filed Nov. 23, 2017, the entire contents of which are hereby incorporated herein by reference.

FIELD

Embodiments of the invention generally relate to a transformer unit, in particular a transformer unit for providing an X-ray tube voltage and to a method for operating a transformer unit.

Backgorund

Imaging devices, for example in medical diagnostics, frequently have an X-ray tube which is used for generating X-ray radiation. In order to generate the radiation a voltage is applied between a cathode and an anode of the X-ray tube, whereby electrons accelerate from the cathode in the direction of the anode and yield the desired X-ray radiation when they strike the anode.

The voltage conventionally has a value in the range of a few kilovolts and is typically generated with the aid of a transformer unit.

Transformers conventionally have a primary side having a primary coil and a secondary side having a secondary coil. The two coils (primary coil and secondary coil) are wound around a shared transformer core. The transformer core conventionally has a ferromagnetic material with a high magnetic permeability. The two coils are magnetically coupled by the transformer core. A secondary voltage is induced in the secondary coil when a primary or exciting voltage is applied. When an electrical load, for example the X-ray tube, is applied to the secondary coil, a secondary current also flows in this coil.

The value of the induced secondary voltage is determined by what is known as a winding ratio of the two coils.

The secondary voltage is regulated to a desired secondary-side desired voltage during operation by an adjustment of the value of the primary voltage.

SUMMARY

The inventors note that highly accurate adjustment of the desirable secondary-side desired voltage is complex owing to losses within a transformer unit. The losses are frequently what are known as scattering losses. In the present case, scattering losses are generally taken to mean a fraction of the magnetic flux which does not penetrate the secondary coil and therefore does not contribute to the induction of the secondary coil. Further types of loss within a transformer unit are for example copper losses, which result due to the material resistance of the coils, which are preferably made from copper, or capacitive losses, which occur between adjacent windings that together act like capacitors. The scattering losses and the capacitive losses are frequently also called parasitic losses.

The inventors have discoverd that the losses, specifically the scattering losses, lead to an undesirable voltage drop during operation of the transformer unit. As a result, for example the actual secondary voltage (secondary-side actual voltage) has a lower value than an ideal secondary voltage which would be expected due to the primary voltage and the winding ratio in the case of an ideal, loss-free transformer unit. The value of the actual secondary-side actual voltage (ideal secondary voltage minus the additional voltage drop caused by scattering losses) can differ from the ideal secondary voltage by several hundred volts as a function of the predefined secondary voltage.

The inventors have discovered that this large difference is undesirable specifically with x-ray apparatuses. Adjustment takes place for example as a function of the secondary-side actual voltage in such a way that this actual voltage is detected at the secondary side and transmitted to the primary side and then the primary voltage is (re-)adjusted as a function thereof. However, this embodiment is complex and cost-intensive. Alternatively, the predefined secondary voltage is detected on the primary side, in which case, however, the additional secondary-side voltage drop caused owing to parasitic effects cannot be detected. The secondary-side actual voltage therefore cannot be accurately determined.

Embodiments of the invention are directed to a transformer unit and a method with the aid of which a secondary-side actual voltage is sufficiently accurately provided in a simple manner.

Advantageous embodiments, developments and variants are the subject matter of the claims.

At least one embodiment is directed toward a A transformer unit, comprising:

a primary side including a primary coil wound around a transformer core and a secondary side including a secondary coil wound around the transformer core, wherein during operation, a secondary-side actual voltage will be established upon application of a primary voltage to the primary coil, the secondary-side actual voltage being affected owing to an additional secondary-side voltage drop caused by secondary-side parasitic effects;

a first measuring coil, wound around the transformer core, to determine a first measuring voltage;

a measuring element, arranged and designed on the primary side to determine a second measuring voltage, the second measuring voltage being correlatable with the additional secondary-side voltage drop; and a controller to control operation of the transformer unit, the controller being designed to
adjust the primary voltage so as to induce a secondary desired voltage in the secondary coil, and
adjust the primary voltage as a function of the first measuring voltage and the second measuring voltage.

At least one embodiment is directed toward a method for operating a transformer unit, the transformer unit including a primary side including a primary coil wound around a transformer core and a secondary side including a secondary coil wound around the transformer core, the method comprising:

applying a primary voltage to the primary coil, to establish a secondary-side actual voltage, affected owing to an additional secondary-side voltage drop caused by secondary-side parasitic effects;

determining, via a first measuring coil wound around the transformer core, a first measuring voltage;

determining a second measuring voltage correlated with the secondary-side voltage drop, with aid of a measuring element arranged on the primary side; and adjusting the primary voltage as a function of the first measuring voltage and the second measuring voltage such that a secondary desired voltage is induced in the secondary coil.

BRIEF DESCRIPTION OF THE DRAWINGS

An example embodiment of the invention will be illustrated in more detail below with reference to the figure. In this figure, partially in a highly simplified diagram.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Most of the aforementioned components, in particular the identification unit, can be implemented in full or in part in the form of software modules in a processor of a suitable control device or of a processing system. An implementation largely in software has the advantage that even control devices and/or processing systems already in use can be easily upgraded by a software update in order to work in the manner according to at least one embodiment of the invention.

The transformer unit of at least one embodiment has a primary side having a primary coil wound around a transformer core and a secondary side having a secondary coil likewise wound around the transformer core.

The primary side and the secondary side are galvanically separated from each other and magnetically coupled together according to the general functional principle of a transformer unit. In the present case, galvanic separation is generally taken to mean that the primary side and the secondary side are in particular not electrically connected together by wires, for example by way of a cable. The primary side and the secondary side are therefore isolated from each other.

During operation of the transformer unit a secondary-side actual voltage is established when a primary voltage is applied to the primary coil. In the present case, the primary voltage is taken to mean an alternating voltage. The secondary-side actual voltage is in particular affected owing to an additional secondary-side voltage drop caused by secondary-side parasitic effects. In other words, the secondary-side actual voltage can be changed, in particular can be reduced, by the additional secondary-side voltage drop in respect of the predefined secondary desired voltage.

Furthermore, the transformer unit has a first measuring coil wound around the transformer core for determining a first measuring voltage. In the present case, the first measuring voltage is specifically taken to mean the secondary desired voltage. The first measuring coil is preferably arranged in a primary-side section of the transformer unit. In other words, the first measuring coil is arranged closer to the primary coil than to the secondary coil. This arrangement of the first measuring coil has proven to be suitable for detecting the secondary desired voltage at the primary side.

The transformer unit has, moreover, a measuring element. The measuring element is arranged on the primary side and designed in such a way that a second measuring voltage is determined by way of the measuring element, which voltage is correlated with the additional secondary-side voltage drop, in particular a leakage inductance. The arrangement of the measuring element on the primary side is based on the consideration that, owing to the magnetic coupling of primary side and secondary side, secondary-side parasitic effects also act on the primary side. The parasitic effects, in particular the scattering effects on the secondary side (for example due to the leakage inductance) can therefore be detected by way of the second measuring voltage on the primary side. In other words, the second measuring voltage is, as it were, the primary-side electrical mirror image of the additional secondary-side voltage drop already mentioned, in particular the leakage inductance.

For controlling the operation of the transformer unit, in particular for providing an X-ray tube voltage, the transformer unit has a control unit. In the present case, the X-ray tube voltage is taken to mean an electrical voltage that can be applied inside the X-ray tube. The X-ray tube voltage can be applied between the cathode and a grid element and in this case is called an X-ray tube blocking voltage. In particular a flow of electrons between the cathode and the anode can be effected hereby; in particular electrons are prevented from flowing from the cathode to the anode when an X-ray tube blocking voltage is applied. For this purpose the grid element is preferably arranged from spatial and structural perspectives between the cathode and the anode inside the X-ray tube. A potential can typically be imposed on the grid element with respect to the cathode, which is more negative relative to the cathode. In particular this prevents the electrons exiting the cathode from drifting to the anode. In other words, in particular a flow of electrons from the cathode to the anode can be prevented or turned off.

Alternatively or additionally, the X-ray tube voltage can be applied between anode and cathode, whereby X-rays are typically generated at the anode. Generation of X-rays can conventionally be interrupted or stopped by way of the X-ray tube blocking voltage if the electrons flow off at the grid element, with, for example, the X-ray tube voltage continuing to be applied between anode and cathode. In other words, the X-ray tube voltage is applied between anode and cathode and the X-ray tube blocking voltage and yet no X-rays are produced or emitted at the anode.

Basically it is also conceivable for the X-ray tube voltage to be applied between an electron determining unit of the cathode and at least one focusing electrode of the cathode. In this case the X-ray tube voltage is typically called the X-ray tube focusing voltage. The electron determining unit is designed in particular for an emission of electrons. The at least one focusing electrode is preferably designed for affecting the electrons in such a way that a path of the electrons between the cathode and the anode is changed. In particular, the at least one focusing electrode can therefore change a position or a size of a focal spot, with the anode typically having the focal spot.

The control unit is designed in such a way that the primary voltage is adjusted and in particular regulated such that a predefined secondary desired voltage, for example said X-ray tube voltage, in particular the X-ray tube voltage between anode and cathode, the X-ray tube blocking voltage and/or the X-ray tube focusing voltage, is induced in the secondary coil. Furthermore, the control unit is designed in such a way that the primary voltage is adjusted as a function of the first measuring voltage and the second measuring voltage.

By adjusting the primary voltage as a function of the first measuring voltage and the second measuring voltage it is preferably possible to determine at the primary side a specific measured value as a function of the current secondary-side actual voltage and in particular to use the specific measured value for an adjustment of the primary voltage. In other words, the specific measured value, therefore the secondary-side actual voltage, is used as the controlled variable for the primary voltage to be adjusted. In particular the secondary-side parasitic effects are considered by the measuring element on the primary side. This achieves the advantage that the primary voltage can be accurately adjusted in such a way that the secondary-side actual voltage approximately matches the predefined secondary desired voltage, in particular the ideal secondary voltage, without the secondary-side actual voltage on the secondary side being measured directly.

In other words, the value of the actual secondary-side actual voltage preferably barely differs from the ideal secondary voltage. In particular, the difference in the actual secondary-side actual voltage from the ideal secondary voltage, or from the predefined secondary desired voltage, is less than 5%, preferably less than 2% and particularly preferably less than 1%. Therefore, in particular a high voltage accuracy is achieved which is conventionally an important aspect in the medical sector.

A further advantage is that the secondary-side actual voltage can be detected and/or adjusted, preferably independently of load, at the primary side. This can mean in particular that the actual secondary-side actual voltage is not transmitted from the secondary side to the primary side over the galvanic separation point.

Specifically, a laborious and cost-intensive transmission can be dispensed with, in which the secondary actual voltage is detected at the secondary side and transmitted to the primary side.

The control unit preferably has an evaluation unit. The evaluation unit is designed for determining the secondary-side actual voltage on the basis of the first measuring voltage and the second measuring voltage. In this connection the control unit is preferably designed for adjusting the primary voltage as a function of the secondary actual voltage. In other words, the evaluation unit outputs a voltage value as the controlled variable, which value matches the determined value of the secondary-side actual voltage. The secondary-side actual voltage is produced in particular, moreover, approximately from the total of the first measuring voltage and second measuring voltage optionally each provided with a weighting factor.

In particular a simple and load-independent adjustment of the primary voltage, and therefore also of the secondary-side actual voltage, is achieved hereby. In the present case, load-independent is specifically taken to mean that the adjustment of the primary voltage is made possible as a function of the secondary actual voltage independently of a secondary-side electrical load, in other words connected to the secondary coil, for example an X-ray tube.

According to an alternative embodiment, the transformer unit can (still) have an additional auxiliary winding which is preferably arranged parallel to the primary coil. Auxiliary windings of this kind are used for example for switch-on current limitation of transformer units and are not imperative components of a transformer unit.

For the case where the inductance value of the auxiliary winding is sufficiently high, a current flow through the auxiliary winding can be ignored in respect of determining the secondary-side actual voltage. In this case the secondary-side actual voltage is preferably determined as already described, in other words, as if the transformer unit did not have an auxiliary winding.

For the case where the inductance value of the auxiliary winding is lower than an inductance value which still just allows the electrical current flowing through the auxiliary winding to be ignored, however, the voltage drop, caused by the current flow, across the auxiliary winding (hereinafter also called the auxiliary voltage) should be considered when determining the secondary-side actual voltage.

Consideration in this connection is preferably such that the secondary-side actual voltage is then determined by an in-phase addition of the auxiliary voltage with the first measuring voltage and the second measuring voltage. In other words, the total, from which the secondary-side actual voltage is preferably determined, is expanded by a term which considers the (additional) voltage drop at the auxiliary winding.

The first measuring voltage and the second measuring voltage as well as the auxiliary voltage are optionally each provided here—analogously to the above-described determination of the secondary-side actual voltage—with a weighting factor.

According to an expedient embodiment, the measuring element is designed as a second measuring coil, in particular in the manner of a compensation coil. In the present case, a compensation coil is specifically taken to mean a coil element which at least reduces resonances that occur during operation of the transformer unit. Resonances of this kind are for example voltage and/or current variations.

In the present case, the measuring element designed as a measuring coil is in particular not used, or not exclusively used, however, for compensation of resonances. Instead, the measuring coil is used for a detection, in particular a measurement, of the second measuring voltage correlated with the secondary-side voltage drop (caused owing to secondary-side parasitic effects).

The processes and mode of operation, in particular the scattering losses of the transformer unit, will be discussed in more detail below for the purpose of more precise explanation:

Scattering losses of this kind are conventionally incorporated for calculation of electrical variables of the transformer unit, for example the secondary desired voltage. In other words, for example in a(n) (equivalent) circuit diagram of a real transformer unit, the scattering losses are conventionally characterized/represented by an inductance, for example through a coil element. This characterization is based on the idea that the undesirable voltage drop due to the scattering losses acts roughly like a voltage drop at an inductance. The inductance is typically called a leakage inductance here. However, in a transformer unit a leakage inductance of this kind does not exist as a real component.

In the present case, a fundamental aspect in this regard can also be seen in that an electrical balance is preferably established in a transformer unit between the primary side and the secondary side. In the present case, the electrical balance is taken to mean that, for example, a change in a voltage on one side (primary side or secondary side) also causes a change in a voltage on the other side respectively and these therefore preferably have a balanced relationship with each other. In other words, in the present example the second measuring voltage on the primary side is correlated by way of a variable with the voltage drop on the secondary side caused by (additional and undesirable) scattering losses. In other words: the second measuring voltage forms the (primary-side) mirror image of the voltage dropping across the leakage inductance. The variable considers for example inductance values of the measuring element and the leakage inductance as well as winding rations formed from two of the coils respectively chosen from the first measuring coil, the primary coil and the secondary coil.

Basically an inductance of the measuring element formed as a measuring coil can have any desired value. The measuring element designed as a measuring coil preferably has the inductance with the value in the range of 500 nH to 1,000 nH and specifically a value in the range of 600 nH to 800 nH. The measuring element hereby has in particular a value that is smaller by, for example, a factor of 5 to 10 than conventional compensation coils. Frequently used compensation coils conventionally have an inductance with a value in the range of 2 µH to 6 µH.

In one development the measuring element is also used as a compensation coil, in other words the characteristic values of the coil are suitably chosen, in particular in such a way that a further compensation coil is optionally omitted.

The measuring element is expediently connected in series with the primary coil. In particular a voltage drop, in the present case, the second measuring voltage, can be determined for example via the evaluation unit hereby.

According to a preferred development, the first measuring coil is terminated with high impedance. In the present case, terminated with high impedance is specifically taken to mean that, for example, an internal resistance of the first measuring coil has a value which, for example, is higher by at least a factor of 5 to a factor of 10 than the value of the internal resistance of the primary coil and/or the secondary coil. This development is based on the idea that, owing to the high-impedance termination of the first measuring coil, a negligibly small coil current flows in this coil, which, as a result of this, exerts a negligible influence on the electrical variables, for example the primary voltage and/or the secondary-side actual voltage. In other words, the first measuring coil is preferably not subject to loading, so the coil current is preferably virtually zero. In this case the coil current in particular does not cause any further drop in voltage.

According to a preferred embodiment, the evaluation unit has an amplifier element, preferably a differential amplifier element. The amplifier element is in particular designed in such a way that it detects the second measuring voltage dropping across the measuring element during operation. The advantage is that simple and inexpensive voltage detection is achieved hereby.

According to an expedient embodiment, the evaluation unit has a first operation amplifying element. The first operation amplifying element is designed in particular to determine the secondary-side actual voltage from the first measuring voltage and from the second measuring voltage during operation. For this purpose the second measuring voltage is multiplied by a weighting factor, in the present case, said variable, and then the operational amplifier adds the two voltages (first and second measuring voltage). The advantage of this embodiment is that the secondary-side actual voltage can be easily determined in terms of circuitry.

In the case of the alternative embodiment of the transformer unit with the auxiliary winding arranged parallel to the primary coil, the first operation amplifying element is in particular designed to determine the secondary-side actual voltage from the first measuring voltage, the second measuring voltage as well as from the auxiliary voltage, during operation. For this purpose the in-phase addition, already mentioned in the statements above relating to the auxiliary winding, of the auxiliary voltage takes places with the first measuring voltage and the second measuring voltage by way of the first operation amplifying element.

Specifically, the first operation amplifying element is designed as a summing amplifying element, also called an adder for short.

According to a preferred embodiment, the evaluation unit has a second operation amplifying element. The second operation amplifying element is designed as a peak value detector. In other words, a peak value of the secondary-side actual voltage determined by the first operation amplifying element is determined by way of the second operation amplifying element during operation.

There is expediently a rectifying element for rectifying the secondary actual voltage during operation of the transformer unit on the secondary side of the transformer unit.

The control unit preferably has an analog-to-digital converter element. The analog-to-digital converter element is designed in such a way that during operation the analog value of the determined secondary-side actual voltage is converted into a digital control signal. In other words, the secondary-side actual voltage on the primary side can be determined, at least approximately, by considering the first measuring voltage and the second measuring voltage, and by way of the analog-to-digital converter element can be converted into the digital control element. That is to say, instead of measuring the value of the secondary-side actual voltage directly, the value of the secondary-side actual voltage is preferably determined with a function of the first measuring voltage and the second measuring voltage. In the present case, the digital control signal is specifically taken to mean that the value of the secondary-side actual voltage, following conversion, is in the form of a predefined number of zeroes and ones and therefore can be used more easily for regulating the primary voltage and therefore for adjusting the secondary desired voltage, for example by a microcontroller.

Alternatively or additionally, regulation takes place for example using an analog control signal. In other words, the analog value of the determined secondary-side actual voltage is used in particular for adjusting the primary voltage.

For adjusting the primary voltage the control unit has a switching power supply and at least two switching elements, preferably semiconductor switching elements, for example transistors.

Here the switching power supply preferably regulates the value of the primary voltage and the at least two switching elements a frequency of the primary voltage in such a way that the desirable secondary desired voltage is induced on the secondary side. In other words, in particular the secondary desired voltage can be regulated by regulating the primary voltage. The switching power supply is additionally or alternatively controlled for example via a microcontroller connected upstream, which controls the switching power supply on the basis of the digital control signal supply.

Experimental measurements have shown that, due to such an adjustment of the primary voltage, in particular on the basis of the secondary-side actual voltage, a difference thereof from the desired and predefined secondary desired voltage with a value merely in the range of 1% to 2% is established.

According to an expedient embodiment, the switching power supply is designed as a Single Ended Primary Inductor Converter (SEPIC). Alternatively, the switching power supply is designed as a step-up converter or a step-down converter.

The advantage of this embodiment can be seen in particular in the simple and inexpensive design of the switching power supply since conventional (mass production) components are used for its implementation.

The transformer unit is preferably arranged in an X-ray apparatus and used in particular for providing an X-ray tube voltage. In other words, the X-ray apparatus preferably has the transformer unit. The X-ray apparatus can have further units typical for X-ray imaging, for example an X-ray detector.

At least one embodiment is directed toward a method for operating a transformer unit. The transformer unit may be, in particular, the described transformer unit.

During operation, the control unit applies the primary voltage to the primary coil wound around the transformer core on the primary side and a secondary-side actual voltage is therefore adjusted, in particular induced, in the secondary coil. The secondary-side actual voltage is typically influenced, in particular reduced, owing to an additional secondary-side voltage drop caused by secondary-side parasitic effects.

A first measuring voltage is determined by way of the first measuring coil likewise arranged around the transformer core in a primary-side section of the transformer unit. The transformer unit has, moreover, the measuring element which is arranged on the primary side in such a way that a second measuring voltage correlated with the secondary-side voltage drop is determined by the measuring element.

By way of the control unit, operation of the transformer unit is preferably controlled such that the primary voltage is adjusted in such a way as to induce the predefined secondary desired voltage in the secondary coil. Furthermore, operation of the transformer unit is in particular controlled in such a way via the control unit that the primary voltage is adjusted as a function of the first measuring voltage and the second measuring voltage.

The advantages and preferred embodiments stated in respect of the transformer unit can logically be transferred to the method and vice versa.

Figure 1:
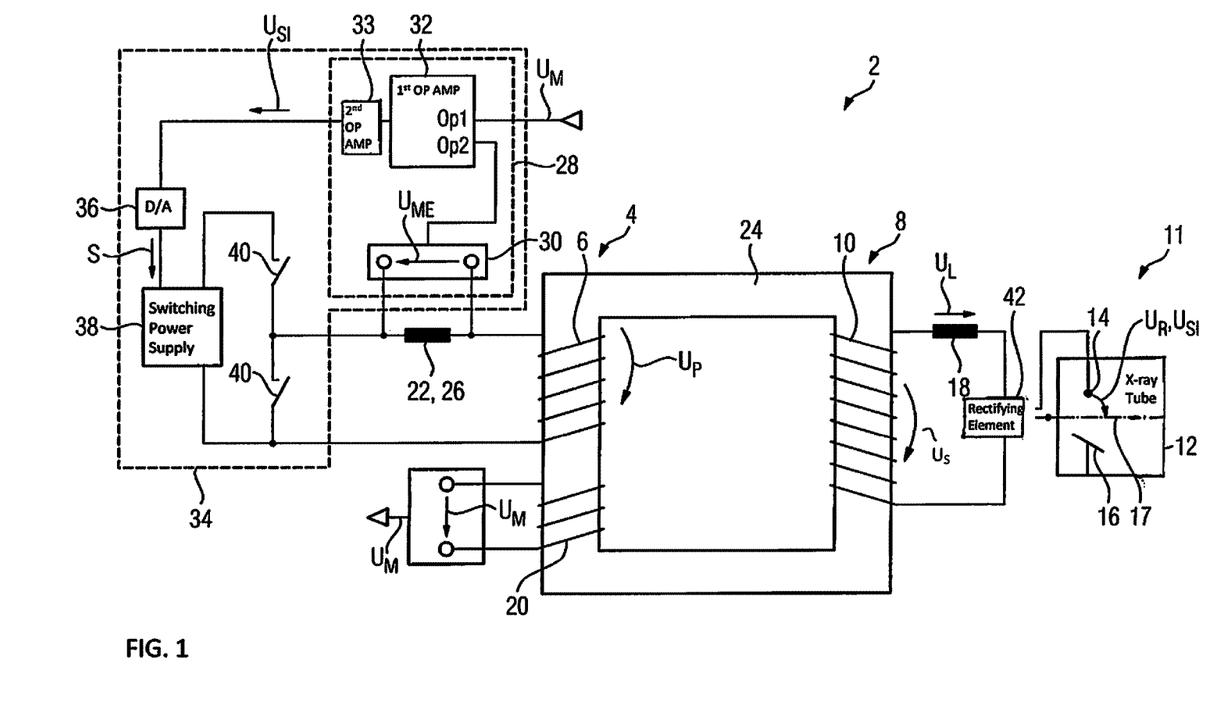
FIG. 1 shows a roughly sketched equivalent circuit diagram of the transformer unit.

FIG. 1 shows a roughly sketched equivalent circuit diagram of a transformer unit 2. Equivalent circuit diagrams are used, for example, in particular in electrotechnology, for calculating electrical variables within a circuit. The special feature of equivalent circuit diagrams is that they represent a circuit which also includes components that are not actually built-in and that have an effect on the switching behavior of the circuit. For example, equivalent circuit diagrams have components which (representatively) characterize losses occurring within the circuit.

The transformer unit 2 has a primary side 4 having a primary coil 6 and a secondary side 8 having a secondary coil 10. The primary coil 6 and the secondary coil 10 preferably have an electrically conductive material, in the example embodiment, copper. An X-ray tube 12 of an X-ray apparatus 11 is connected to the secondary coil 10 and therefore at the secondary side. Specifically, the X-ray tube 12 in the example embodiment has a cathode 14 and an anode 16. Furthermore, the X-ray tube 12 has a grid element 17. The grid element 17 is arranged between the cathode 14 and the anode 16.

The transformer unit 2 is used in the example embodiment for providing an X-ray tube voltage $U_R$. The X-ray tube voltage $U_R$, in this example embodiment, the X-ray tube blocking voltage, is applied during operation, as required, between the cathode 14 and the grid element 17 and prevents a flow of electrons from the cathode 14 to the anode 16.

Since a direct voltage is required, in particular for the X-ray tube blocking voltage, the transformer unit 2 has a rectifying element 42 on the secondary side 8. The rectifying element 42 is used for rectifying the secondary actual voltage (which matches X-ray tube voltage $U_R$ and in this case the X-ray tube blocking voltage) and is arranged spatially and structurally for this purpose between the secondary coil 10 and the X-ray tube 12.

In the equivalent circuit diagram of FIG. 1 an inductance element 18 is arranged between the secondary coil 10 and the X-ray tube 12. The inductance element 18 in the example embodiment is a leakage inductance. The leakage inductance describes scattering losses that occur within the equivalent circuit diagram on the secondary side, so they can be used for calculations.

A voltage drop across the leakage inductance is considered for this purpose in the example embodiment. The inductance element 18 is not arranged as a real component in the transformer unit 2. A voltage drop $U_L$ (also called an additional secondary voltage drop) at the leakage inductance reduces the value of the secondary desired voltage $U_S$, so a secondary-side actual voltage $U_{SI}$ is applied to the X-ray tube 12, which, greatly simplified, results from the difference between an ideal secondary actual voltage USI and the voltage drop $U_L$ across the leakage inductance.

A first measuring coil 20 is arranged on the primary side 4 of the transformer unit 2. A first measuring voltage $U_M$ can be detected via the first measuring coil 20. The primary voltage $U_P$ is the voltage which is applied to the primary coil 6 during operation of the transformer unit 2. The primary coil 6, the secondary coil 10 and the first measuring coil 20 are wound around a transformer core 24 for this purpose and to form the functionality of the transformer unit 2. The transformer core 24 has a ferromagnetic material, for example iron. During operation, the secondary desired voltage $U_S$ is induced through the primary voltage $U_P$ in the secondary coil according to the law of induction.

Furthermore, a measuring element 26, in the example embodiment a second measuring coil 22, is arranged at the primary side 4 as a real component. The measuring element 26 is illustrated in the equivalent circuit diagram of FIG. 1 as an inductance element and therefore with the conventional wiring symbol of an inductance element. In the example embodiment the measuring element 26 has an inductance with a value in the range of 500 nH to 1,000 nH, whereby it is delimited in particular by compensation coils that are often likewise arranged at the primary side.

The transformer unit 2 also has a control unit 34. In the example embodiment the control unit 34 has an evaluation unit 28. In the example embodiment the evaluation unit 28 is designed to determine the secondary-side actual voltage $U_{SI}$. For this purpose the evaluation unit 28 has an amplifier element 30, in the example embodiment, a differential amplifier, for detecting a second measuring voltage UME across the measuring element 26.

Furthermore, the evaluation unit 28 has a first operation amplifying element 32 with two inputs (Op1, Op2). In the example embodiment the first operation amplifying element 32 is designed as a summing amplifier, specifically as an adder, which in each case adds the signal at the inputs Op1 and Op2. In the example embodiment the value of the first measuring voltage $U_M$ is applied at the input Op1 and the value of the second measuring voltage $U_{ME}$ at input Op2, so these two voltage values are added to form an output value. The output value of the first operation amplifying element 32 is transferred during operation to a second operation amplifying element 33, which is likewise part of the evaluation unit 28. In the example embodiment the second operation amplifying element 33 is designed as a peak value detector. During operation the second operation amplifying element 33 determines a peak value of the output value transmitted by the first operation amplifying element 32. The output value of the second operation amplifying element 33 in the example embodiment therefore preferably matches a peak value of the secondary-side actual voltage $U_{SI}$. For the purpose of better understanding, electrotechnical relationships within the transformer unit 2 will be briefly discussed below:

The value of the secondary-side actual voltage $U_{SI}$ can be determined by the total of the first measuring voltage $U_M$ and the second measuring voltage $U_{ME}$ multiplied by a weighting factor G by way of a suitable mesh and node formation for calculating the individual (partial) voltages and (partial) currents within the transformer unit and consideration of the electrotechnical relationships of primary side 4 to secondary side 8. The weighting factor G considers the individual inductance values of the measuring element 26 and the inductance element 18 as well as winding ratios of the primary coil 6, secondary coil 10 as well as the first measuring coil 20. The following relationship between the secondary-side actual voltage $U_{SI}$ and the two measured voltages $U_M$, $U_{ME}$ can be derived hereby:

$$U_{SI}/ü_{23}=-G*U_{ME}+U_M$$

Here $ü_{23}$ describes the winding ratio of the first measuring coil 20 in relation to the secondary coil 10. The weighting factor G is composed as follows:

$$G=(L_{s2}*ü_{12})/(L_{ME}*ü_{23})$$

Here $L_{s2}$ describes the value of the secondary-side leakage inductance and $ü_{12}$ the winding ratio of the primary coil 6 in relation to the secondary coil 10. The factor $L_{ME}$ describes the inductance value of the second measuring coil 22.

In the case where the transformer unit 2 has an auxiliary winding (not shown) arranged parallel to the primary coil 6, at which winding an auxiliary voltage $U_H$ drops during operation and the inductance value of the auxiliary winding is lower than an inductance value which still just allows the electric current flowing through the auxiliary winding to be ignored, the following relationship can be derived between the secondary-side actual voltage $U_{SI}$, the two measured voltages $U_M$, $U_{ME}$ as well as the auxiliary voltage $U_H$:

$$U_{SI}/ü_{23}=-G*U_{ME}+U_M+U_H$$

Here $U_H$ is composed as follows:

$$U_H=L_{s2}*(N_1^2/N_2^2)*(U_M/L_M)$$

Here $N_1$ describes the number of windings of the auxiliary winding, $N_2$ the number of windings of the secondary coil 10 and $L_M$ the value of the main inductance.

In the present case, mesh and node formation is taken to mean use of the Kirchhoff laws, according to which the total within a mesh of dropping (partial) voltages and the total of (partial) currents flowing into and out of a node is equal to zero. In the present case, mesh is taken to mean a closed circuit along electrical lines within a circuit. In the present case, node is taken to mean a branch within a circuit, from which at least three lines branch off.

In the present case, electrotechnical ratios between primary side 4 and secondary side 8 are for example taken to mean that the secondary desired voltage $U_S$ can be determined from the primary voltage $U_P$ and the winding ratio of the number of windings of the secondary coil 10 to the number of windings.

In the example embodiment the control unit 34 is used, moreover, for adjusting the primary voltage $U_P$ as a function of the determined secondary-side actual voltage $U_{SI}$. For this purpose the control unit 34 has an analog-to-digital converter element 36, a switching power supply 38, as well as at least two switching elements 40. In the example embodiment the analog-to-digital converter element 36 is designed to convert the value of the determined secondary-side actual voltage $U_{SI}$ into a digital control signal S. In the example embodiment the switching power supply 38 is designed as a Single Ended Primary Inductor Converter (SEPIC) and regulates the value of the primary voltage $U_P$ as a function of the control signal S. Alternatively, the switching power supply 38 is designed as a step-up converter or as a step-down converter. The at least two switching elements 40 are used for generating an alternating voltage as the primary voltage $U_P$. In the example embodiment the switching elements 40 are designed as semiconductor switches, for example as transistors.

Experimental measurements and simulations have shown that the secondary-side actual voltages $U_{SI}$, which were generated via the transformer unit 2 of FIG. 1, have a difference with a value in a range of 1.5% to 2.5% from the predefined desired voltage $U_S$. These deviation values were likewise maintained with different electrical loads connected at the secondary-side. In the present case, a load connected at the secondary side is taken to mean, for example, an X-ray tube 12.

The object of embodiments of the invention are not limited to the example embodiments described above. Instead, a person skilled in the art can derive further embodiments of the invention from the description above. In particular, the individual features of the invention and their varied embodiments described using the various example embodiments can also be combined with each other in a different way.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A transformer unit, comprising:
    a primary side including a primary coil wound around a transformer core and a secondary side including a secondary coil wound around the transformer core, wherein during operation, a secondary-side actual voltage is establishable upon application of a primary voltage to the primary coil, the secondary-side actual voltage being affected owing to an additional secondary-side voltage drop caused by secondary-side parasitic effects;
    a first measuring coil, wound around the transformer core, to determine a first measuring voltage;
    a measuring element, arranged and designed on the primary side to determine a second measuring voltage, the second measuring voltage being correlatable with the additional secondary-side voltage drop; and
    a controller to control operation of the transformer unit, the controller being designed to
        adjust the primary voltage so as to induce a secondary desired voltage in the secondary coil, and
        adjust the primary voltage as a function of the first measuring voltage and the second measuring voltage, wherein the controller includes an evaluation unit, designed to determine the secondary-side actual voltage based upon the first measuring voltage and the second measuring voltage, and wherein the controller is designed to adjust the primary voltage as a function of the secondary-side actual voltage determined.

2. The transformer unit of claim 1, wherein an auxiliary winding is arranged parallel to the primary coil and the evaluation unit is designed to determine the secondary-side actual voltage based upon the first measuring voltage, the second measuring voltage and an auxiliary voltage which drops across the auxiliary winding.

3. The transformer unit of claim 1, wherein the measuring element is designed as a second measuring coil.

4. The transformer unit of claim 1, wherein a difference between the secondary-side actual voltage and the secondary desired voltage is less than 5%.

5. The transformer unit of claim 1, wherein the measuring element is connected in series with the primary coil.

6. The transformer unit of claim 1, wherein the first measuring coil is terminated with high impedance.

7. The transformer unit of claim 1, further comprising:
    an amplifier element designed to, during operation, detect the second measuring voltage dropping across the measuring element.

8. The transformer unit of claim 1, wherein the controller includes an analog-to-digital-converter element, designed to convert the secondary-side actual voltage determined into a digital control signal.

9. The transformer unit of claim 1, wherein the controller includes a switching power supply and at least two switching elements, wherein during operation, the primary voltage is adjustable via the switching power supply and the at least two switching elements as a function of the secondary-side actual voltage.

10. The transformer unit of claim 9, wherein the switching power supply is designed as a Single Ended Primary Inductor Converter.

11. The transformer unit of claim 1, arranged in an X-ray apparatus for providing an X-ray tube voltage.

12. The transformer unit of claim 1, wherein the transformer unit is for providing an X-ray tube voltage for an X-ray apparatus.

13. An X-ray apparatus, comprising the transformer unit of claim 1, wherein the transformer unit is for providing an X-ray tube voltage and wherein the X-ray apparatus is configured to receive the X-ray tube voltage from the transformer unit.

14. An X-ray apparatus, comprising the transformer unit of claim 1.

15. The transformer unit of claim 1, wherein the evaluation unit includes a first operation amplifying element designed to, during operation, determine the secondary-side actual voltage from the first measuring voltage and the second measuring voltage.

16. The transformer unit of claim 15, wherein the first operation amplifying element is designed as a summing amplifier element.

17. The transformer unit of claim 16, wherein the evaluation unit includes a second operation amplifying element, designed as a peak value detector.

18. The transformer unit of claim 17, wherein the controller includes an analog-to-digital-converter element, designed to convert the secondary-side actual voltage determined into a digital control signal.

19. A method for operating a transformer unit, the transformer unit including a primary side including a primary coil wound around a transformer core and a secondary side including a secondary coil wound around the transformer core, the method comprising:
- applying a primary voltage to the primary coil, to establish a secondary-side actual voltage, affected owing to an additional secondary-side voltage drop caused by secondary-side parasitic effects;
- determining, via a first measuring coil wound around the transformer core, a first measuring voltage;
- determining a second measuring voltage correlated with the secondary-side voltage drop, with aid of a measuring element arranged on the primary side;
- determining the secondary-side actual voltage based upon the first measuring voltage and the second measuring voltage; and
- adjusting the primary voltage as a function of the secondary-side actual voltage determined such that a secondary desired voltage is induced in the secondary coil.

* * * * *